US012796035B2

(12) United States Patent
Kim et al.

(10) Patent No.: US 12,796,035 B2
(45) Date of Patent: Nov. 10, 2026

(54) MEMORY DEVICE

(71) Applicant: Samsung Electronics Co., Ltd., Suwon-si (KR)

(72) Inventors: Yehwan Kim, Seoul (KR); Cheongjun Kim, Suwon-si (KR); Samjong Choi, Suwon-si (KR); Yeonsook Kim, Hwaseong-si (KR); Euido Kim, Ansan-si (KR); Gayeong Baek, Anyang-si (KR); Munkeun Lee, Seoul (KR); Hwon Im, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 574 days.

(21) Appl. No.: 18/051,907

(22) Filed: Nov. 2, 2022

(65) Prior Publication Data

US 2023/0299142 A1 Sep. 21, 2023

(30) Foreign Application Priority Data

Nov. 4, 2021 (KR) ........................ 10 2021 0150858

(51) Int. Cl.
*H10B 80/00* (2026.01)
*G11C 16/04* (2006.01)
(Continued)

(52) U.S. Cl.
CPC ....... *H10D 62/364* (2025.01); *G11C 16/0483* (2013.01); *H10B 41/27* (2023.02); (Continued)

(58) Field of Classification Search
CPC .................. C30B 15/04; H10D 62/364; G11C 16/0483; H01L 25/0657; H10B 41/27; H10B 41/35; H10B 43/27; H10B 80/00
See application file for complete search history.

(56) References Cited

U.S. PATENT DOCUMENTS 7,754,585 B2 7/2010 Sato et al.
8,961,685 B2 2/2015 Nakai et al.
(Continued)

FOREIGN PATENT DOCUMENTS

EP 2659030 B1 1/2015
JP H07309693 A 11/1995
(Continued)

OTHER PUBLICATIONS

Tanzawa, Toru, et al. "Circuit techniques for a 1.8-V-only NAND flash memory." IEEE Journal of Solid-State Circuits 37.1 (2002): 84-89. (Year: 2002).*

Wang, Jong Hoe. "Resistivity distribution of silicon single crystals using codoping." Journal of crystal growth 280.3-4 (2005): 408-412. (Year: 2005).*

*Primary Examiner* — Jacob Y Choi
*Assistant Examiner* — Aaron Michael Wegner
(74) *Attorney, Agent, or Firm* — Wolf, Greenfield & Sacks, P.C.

(57) ABSTRACT

A memory device includes a substrate, a three-dimensional (3D) NAND memory cell array on the substrate, and a peripheral circuit including a transistor on the substrate. The substrate includes p-type impurities and n-type impurities, a concentration of the n-type impurities in the substrate is lower than a concentration of the p-type impurities in the substrate, and the concentration of the n-type impurities in the substrate is about $2\times10^{14}$ atoms/cm$^3$ to about $1.5\times10^{15}$ atoms/cm$^3$ while the concentration of the p-type impurities in the substrate is about $9\times10^{14}$ atoms/cm$^3$ to about $2\times10^{15}$ atoms/cm$^3$.

11 Claims, 16 Drawing Sheets

(51) Int. Cl.

| | |
|---|---|
| ***H10B 41/27*** | (2023.01) |
| ***H10B 41/35*** | (2023.01) |
| ***H10B 41/40*** | (2023.01) |
| ***H10B 43/27*** | (2023.01) |
| ***H10B 43/35*** | (2023.01) |
| ***H10B 43/40*** | (2023.01) |
| ***H10D 62/17*** | (2025.01) |
| ***H10W 90/00*** | (2026.01) |
| *H10W 72/00* | (2026.01) |
| *H10W 90/20* | (2026.01) |

(52) U.S. Cl.

CPC ............. *H10B 41/35* (2023.02); *H10B 41/40* (2023.02); *H10B 43/27* (2023.02); *H10B 43/35* (2023.02); *H10B 43/40* (2023.02); *H10B 80/00* (2023.02); *H10W 90/00* (2026.01); *H10W 72/865* (2026.01); *H10W 72/884* (2026.01); *H10W 90/20* (2026.01); *H10W 90/732* (2026.01); *H10W 90/734* (2026.01); *H10W 90/752* (2026.01); *H10W 90/754* (2026.01); *H10W 90/792* (2026.01)

(56) References Cited

U.S. PATENT DOCUMENTS

| | | | | |
|---|---|---|---|---|
| 10,109,644 | B2 | 10/2018 | Shin et al. | |
| 10,283,493 | B1 | 5/2019 | Nishida | |
| 10,526,728 | B2 | 1/2020 | Kudo et al. | |
| 2004/0048456 | A1 * | 3/2004 | Sato .................. | H10D 30/0213 257/E21.321 |
| 2010/0117134 | A1 * | 5/2010 | Nishihara ............ | H10D 30/693 257/314 |
| 2013/0277809 | A1 * | 10/2013 | Nakai ...................... | C30B 15/00 257/627 |
| 2023/0005861 | A1 * | 1/2023 | Wang ...................... | H01L 24/08 |

FOREIGN PATENT DOCUMENTS

| | | | |
|---|---|---|---|
| JP | 2846986 | B2 | 1/1999 |
| JP | 2002134518 | A | 5/2002 |
| JP | 2010248013 | A | 11/2010 |
| JP | 5070916 | B2 | 8/2012 |
| KR | 101522480 | B1 | 5/2015 |
| KR | 20170137257 | A | 12/2017 |
| KR | 20200039800 | A | 4/2020 |

* cited by examiner

II - II'

MEMORY DEVICE

CROSS-REFERENCE TO RELATED APPLICATION

This application is based on and claims priority under 35 U.S.C. § 119 to Korean Patent Application No. 10-2021-0150858, filed on Nov. 4, 2021, in the Korean Intellectual Property Office, the disclosure of which is incorporated by reference herein in its entirety.

BACKGROUND

The inventive concept relates to a memory device, and more particularly, to a memory device including a three-dimensional (3D) NAND memory cell array.

In an electronic system that uses data storage, a semiconductor device capable of storing high capacity data may be needed. Accordingly, a method capable of increasing a data storage capacity of a semiconductor device is being studied. For example, as one of the technologies for increasing the data storage capacity of a semiconductor device, a 3D NAND flash memory device having three-dimensionally arranged memory cells instead of two-dimensionally arranged memory cells has been proposed.

SUMMARY

The inventive concept provides a memory device having a small variation of electrical characteristics.

According to some embodiments of the inventive concept, a memory device includes a substrate; a three-dimensional (3D) NAND memory cell array on the substrate, and a peripheral circuit including a transistor on the substrate. The substrate includes p-type impurities and n-type impurities, a concentration of the n-type impurities in the substrate is lower than a concentration of the p-type impurities in the substrate, and the concentration of the n-type impurities in the substrate is about $2\times10^{14}$ atoms/cm$^3$ to about $1.5\times10^{15}$ atoms/cm$^3$, and the concentration of the p-type impurities in the substrate is about $9\times10^{14}$ atoms/cm$^3$ to about $2\times10^{15}$ atoms/cm$^3$. According to some embodiments of the inventive concept, a memory device includes a first substrate, a peripheral circuit including a transistor on the first substrate, an insulating layer on the first substrate and the peripheral circuit; a second substrate on the insulating layer, and a 3D NAND memory cell array on the second substrate. The first substrate includes p-type impurities and n-type impurities, a concentration of the n-type impurities in the first substrate is lower than a concentration of the p-type impurities in the first substrate, and the concentration of the n-type impurities in the first substrate is about $2\times10^{14}$ atoms/cm$^3$ to about $1.5\times10^{15}$ atoms/cm$^3$ while the concentration of the p-type impurities in the first substrate is about $9\times10^{14}$ atoms/cm$^3$ to about $2\times10^{15}$ atoms/cm$^3$.

According to some embodiments of the inventive concept, a memory device includes a first structure and a second structure on the first structure. The first structure includes a first substrate, a 3D NAND memory cell array on the first substrate, a first insulating layer on the first substrate and the 3D NAND memory cell array, and a plurality of first bonding pads on the first insulating layer and electrically connected to the 3D NAND memory cell array, and the second structure includes, a second substrate, a peripheral circuit including a transistor on the second substrate, a second insulating layer on the second substrate and the peripheral circuit; and a plurality of second bonding pads on the second insulating layer and electrically connected to the peripheral circuit, and wherein the plurality of first bonding pads are respectively in contact with the plurality of second bonding pads, the second substrate includes p-type impurities and n-type impurities, a concentration of the n-type impurities in the second substrate is lower than a concentration of the p-type impurities in the second substrate, and the concentration of the n-type impurities in the second substrate is about $2\times10^{14}$ atoms/cm$^3$ to about $1.5\times10^{15}$ atoms/cm$^3$ while the concentration of the p-type impurities in the second substrate is about $9\times10^{14}$ atoms/cm$^3$ to about $2\times10^{15}$ atoms/cm$^3$.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1A:
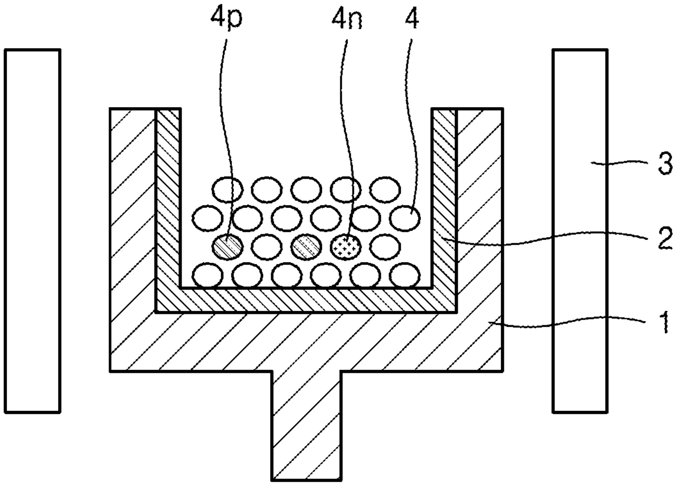
FIGS. 1A through 1F are diagrams illustrating a wafer manufacturing method according to some embodiments of the inventive concept.

FIGS. 1A through IF are diagrams illustrating a wafer manufacturing method according to some embodiments of the inventive concept.

Referring to FIG. 1A, polysilicon 4, p-type impurities 4*p*, and/or n-type impurities 4*n* are introduced into a crucible 2. The p-type impurities 4*p* may include, for example, group 13 elements such as boron (B), aluminum (Al), gallium (Ga), indium (In), etc. The n-type impurities 4*n* may include, for example, group 15 elements such as phosphorus (P), arsenic (As), etc. The crucible 2 may be placed in a susceptor 1. The polysilicon 4, the p-type impurities 4*p*, and the n-type impurities 4*n* in the crucible 2 may be heated using a heater 3.

Figure 1B:
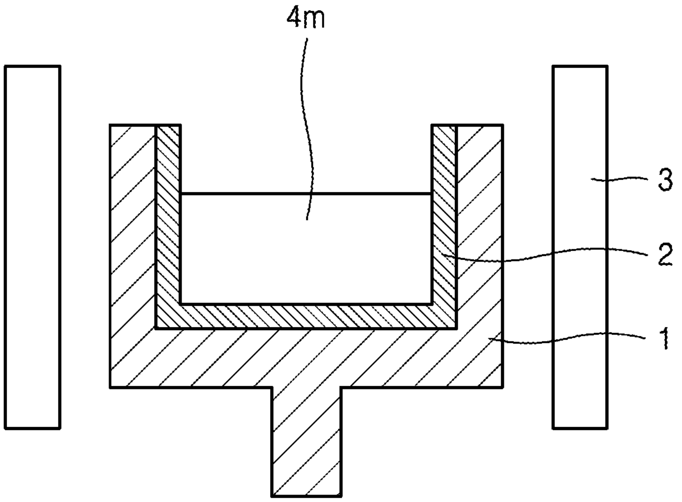

Referring to FIGS. 1A and 1B, a molten material 4*m* may be formed in the crucible 2 by heating the polysilicon 4, the p-type impurities 4*p*, and the n-type impurities 4*n* therein using the heater 3.

Figure 1C:
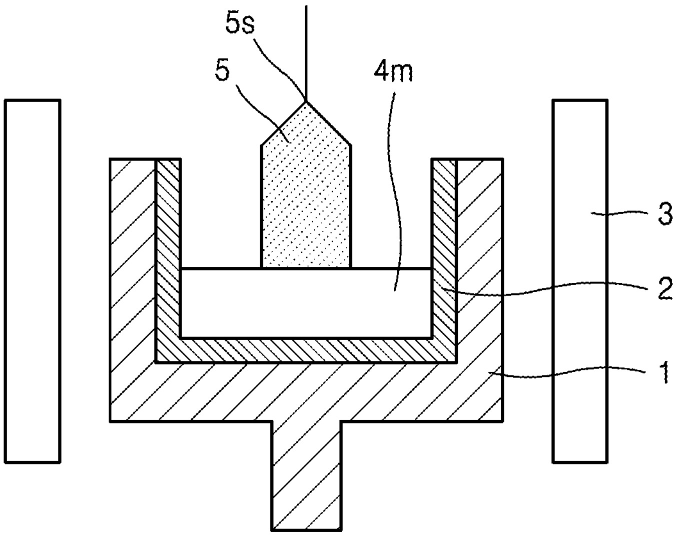

Referring to FIG. 1C, a single crystal silicon seed 5*s* may be brought into contact with a surface of the molten material 4*m*. Subsequently, the single crystal silicon seed 5*s* is pulled up while rotating the single crystal silicon seed 5*s*. In this case, as the molten material 4*m* is cooled, the single crystal silicon seed 5*s* grows to produce an ingot 5.

Figure 1D:
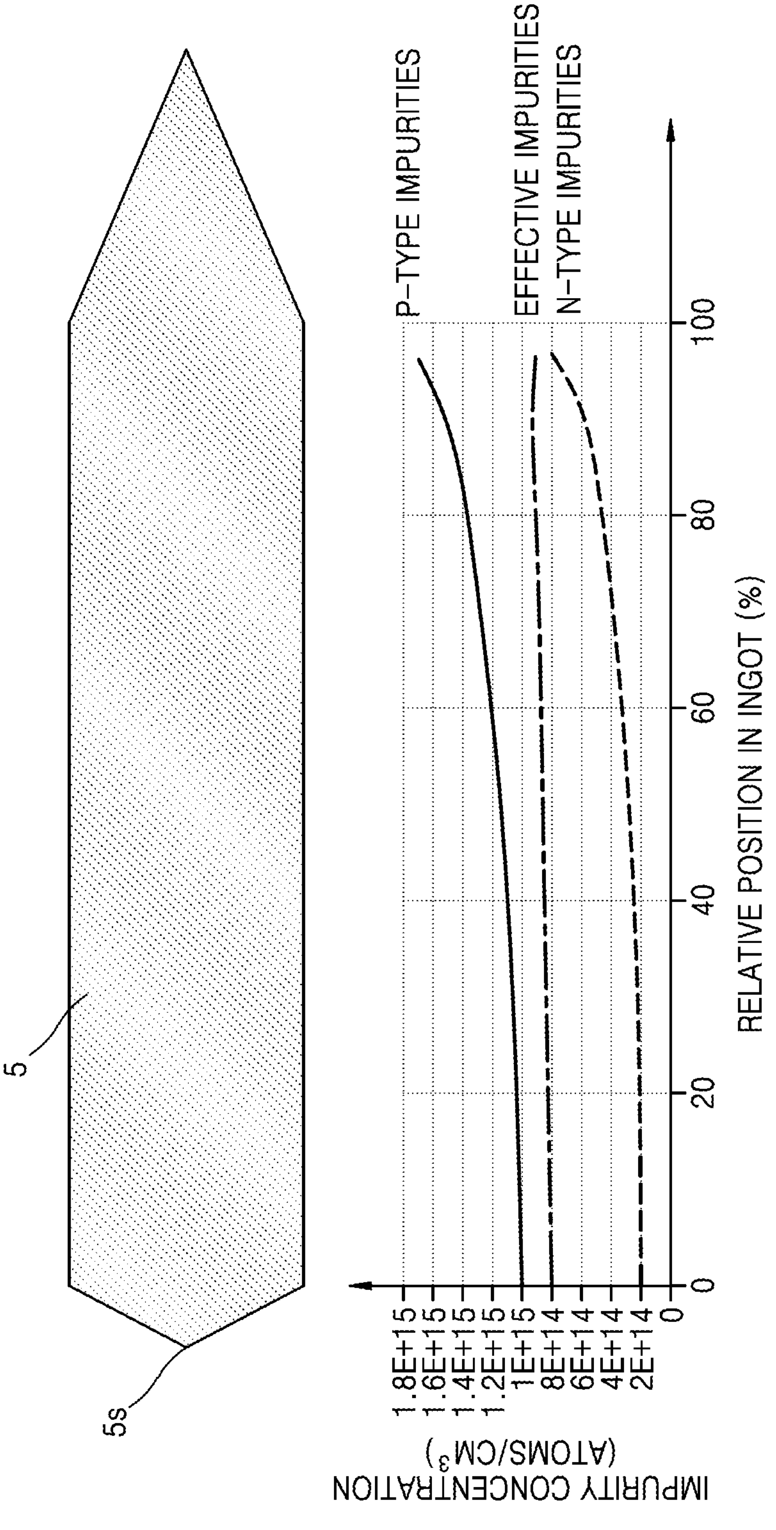

FIG. 1D shows an impurity concentration with respect to a relative position in the ingot 5. Referring to FIG. 1D, a p-type impurity concentration changes by about $0.7\times10^{15}$ atoms/cm$^3$ (=$1.7\times10^{15}$ atoms/cm$^3$-$1\times10^{15}$ atoms/cm$^3$) according to a relative position in the ingot 5. On the other hand, an n-type impurity concentration also changes by about $6\times10^{14}$ atoms/cm$^3$ (=$8\times10^{14}$ atoms/cm$^3$-$2\times10^{14}$ atoms/cm$^3$) according to a relative position in the ingot 5. An effective impurity concentration may be defined as a difference between a p-type impurity concentration and an n-type impurity concentration. The effective impurity concentration may change by about $1\times10^{14}$ atoms/cm$^3$. In other words, although variations in the p-type impurity concentration and the n-type impurity concentration in the ingot 5 are relatively large, a variation in the p-type impurity concentration is offset by a variation in the n-type impurity concentration, so that the effective impurity concentration may be relatively constant. On the other hand, in the related art in which an n-type impurity is not used, a variation in a p-type impurity concentration is not offset by a variation in an n-type impurity concentration, so a variation in an effective impurity concentration may also be relatively large.

Figure 1E:
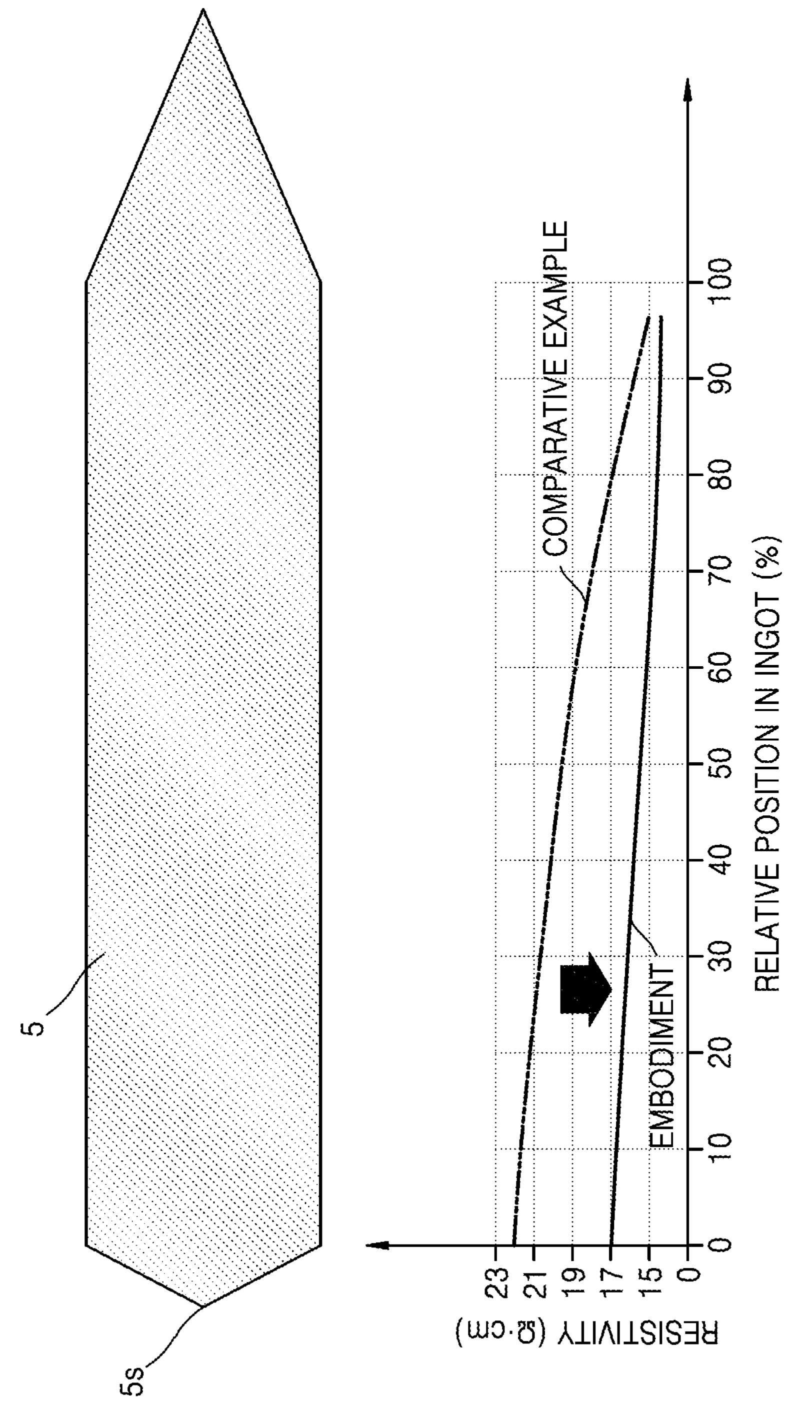

FIG. 1E illustrates resistivities with respect to a relative position in the ingot 5 according to some embodiments and a comparative example. Referring to FIG. 1E, only a p-type impurity is used in the comparative example while p- and n-type impurities are used in some embodiments. In detail, in the comparative example, B having a concentration of about $5.0\times10^{14}$ atoms/cm$^3$ to about $1.0\times10^{15}$ atoms/cm$^3$ is used as a p-type impurity, and in the embodiment, B having a concentration of about $9.0\times10^{14}$ atoms/cm$^3$ to about $2.0\times10^{15}$ atoms/cm$^3$ and P having a concentration of about $2.0\times10^{14}$ atoms/cm$^3$ to about $1.5\times10^{15}$ atoms/cm$^3$ are respectively used as p-type and n-type impurities. A variation in resistivity in the ingot 5 is about 7 ohms centimeter (Ω·cm) (=22 Ω·cm-15 Ω·2 cm) in the comparative example, whereas a variation in resistivity in the ingot 5 is about 3 Ω·cm (=17 Ω·cm-14 Ω·cm) in the embodiment. In other words, in the embodiment, the variation in resistivity in the ingot 5 is smaller than in the comparative example. As described with reference to FIG. 1D, this is because a variation in an effective impurity concentration along a position in the ingot 5 in the embodiment is smaller than a variation in an effective impurity concentration along a position in the ingot 5 in the comparative example. Therefore, the concentration of the n-type impurities in the substrate of about $2\times10^{14}$ atoms/cm$^3$ to about $1.5\times10^{15}$ atoms/cm$^3$, and the concentration of the p-type impurities in the substrate is about $9\times10^{14}$ atoms/cm$^3$ to about $2\times10^{15}$ atoms/cm$^3$ may be critical to achieving a lower desired resistance, such as a resistivity of the substrate of about 14 ohms centimeter (Ω·cm) to about 17 Ω·cm.

Figure 1F:
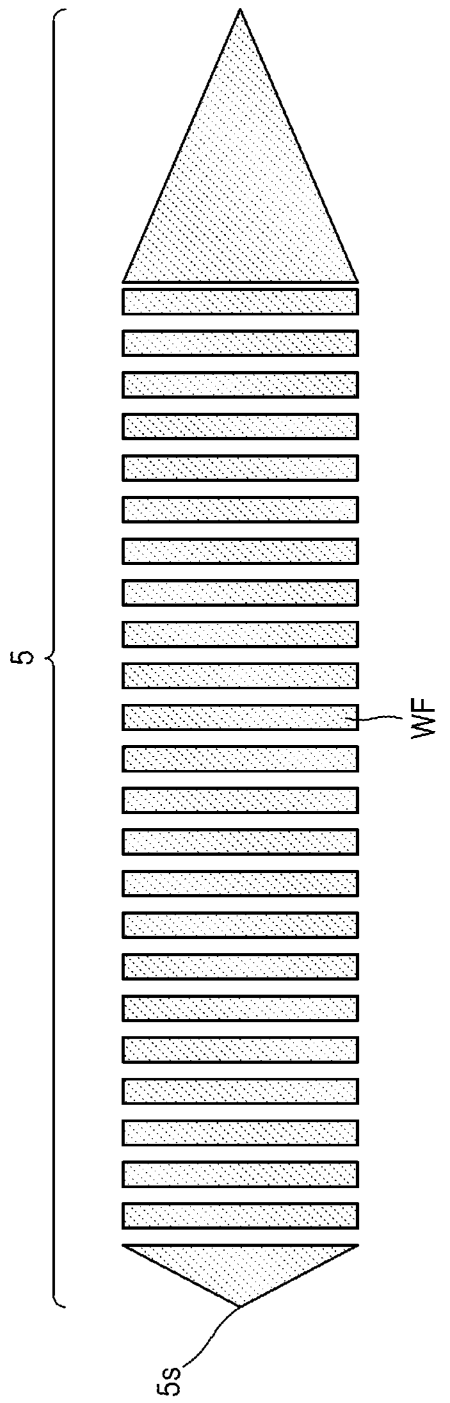

Referring to FIG. 1F, a plurality of wafers WF may be produced from the ingot 5 by cutting the ingot 5. Thereafter, surfaces of the wafers WF may be polished.

Figure 2:
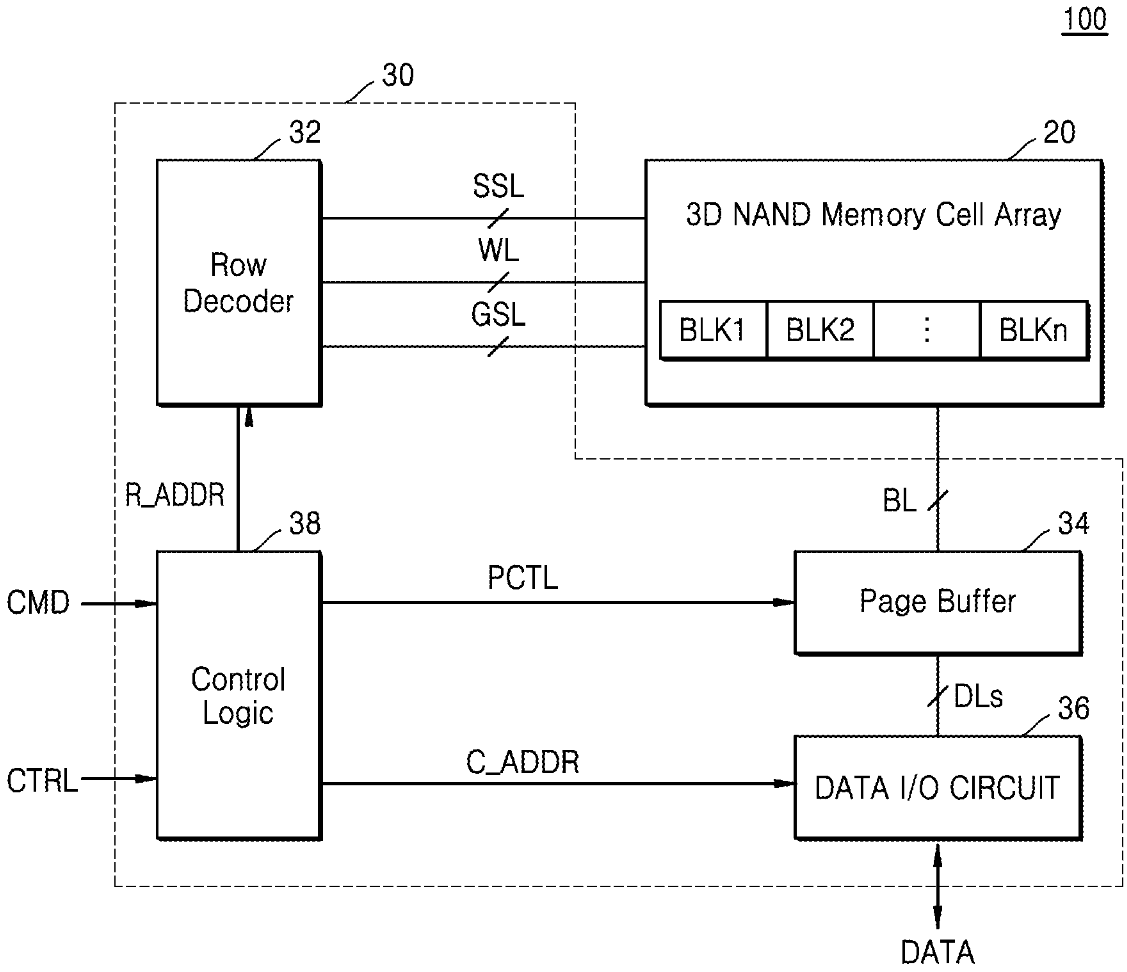
FIG. 2 is a block diagram of a memory device according to some embodiments of the inventive concept.

FIG. 2 is a block diagram of a memory device 100 according to some embodiments of the inventive concept.

Referring to FIG. 2, the memory device 100 may include a three-dimensional (3D) NAND memory cell array 20 and a peripheral circuit 30. The peripheral circuit 30 may include a row decoder 32, a page buffer 34, a data input/output (I/O) circuit 36, and a control logic 38. Although not shown in FIG. 1, the peripheral circuit 30 may include various circuits such as a voltage generation circuit for generating various voltages necessary for an operation of the memory device 100, an error correction circuit for correcting errors in data that is read from the 3D NAND memory cell array 20, etc.

The 3D NAND memory cell array 20 may be connected to the page buffer 34 through bit lines BL, and may be connected to the row decoder 32 through word lines WL, a string select line SSL, and a ground select line GSL. The 3D NAND memory cell array 20 may include a plurality of memory cell blocks BLK1 through BLKn. Each of the memory cell blocks BLK1 through BLKn may include a plurality of memory cells. Each of the memory cells may be a flash memory cell. A detailed circuit of each of the memory cell blocks BLK1 through BLKn is described in more detail below with reference to FIG. 3.

The row decoder 32 may selectively apply, in response to a row address R_ADDR, a voltage to a word line WL, a string select line SSL, and a ground select line GSL corresponding to a memory cell block.

The page buffer 34 may be connected to the 3D NAND memory cell array 20 via the bit lines BL. The page buffer 34 may operate as a write driver during a program operation to apply a voltage corresponding to data to be stored in the 3D NAND memory cell array 20 to the bit lines BL, and operate as a sense amplifier during a read operation to sense the data stored in the 3D NAND memory cell array 20. The page buffer 34 may operate according to a control signal PCTL provided from the control logic 38.

The data I/O circuit 36 may be connected to the page buffer 34 through a plurality of data lines DLs. During a program operation, the data I/O circuit 36 may receive data from a memory controller (not shown) and provide program data to the page buffer 34, based on a column address C_ADDR provided from the control logic 38. During a read operation, the data I/O circuit 36 may provide read data stored in the page buffer 34 to the memory controller, based on the column address C_ADDR provided from the control logic 38. The data I/O circuit 36 may transmit an input address or instruction to the control logic 38 or the row decoder 32.

The control logic 38 may receive a command CMD and a control signal CTRL from the memory controller. The control logic 38 may provide a row address R_ADDR to the row decoder 32 and a column address C_ADDR to the data I/O circuit 36. The control logic 38 may generate various internal control signals used in the memory device 100 in response to the control signal CTRL. For example, the control logic 38 may adjust voltage levels to be provided to the word lines WL and the bit lines BL when performing a memory operation such as a program operation or an erase operation.

Figure 3:
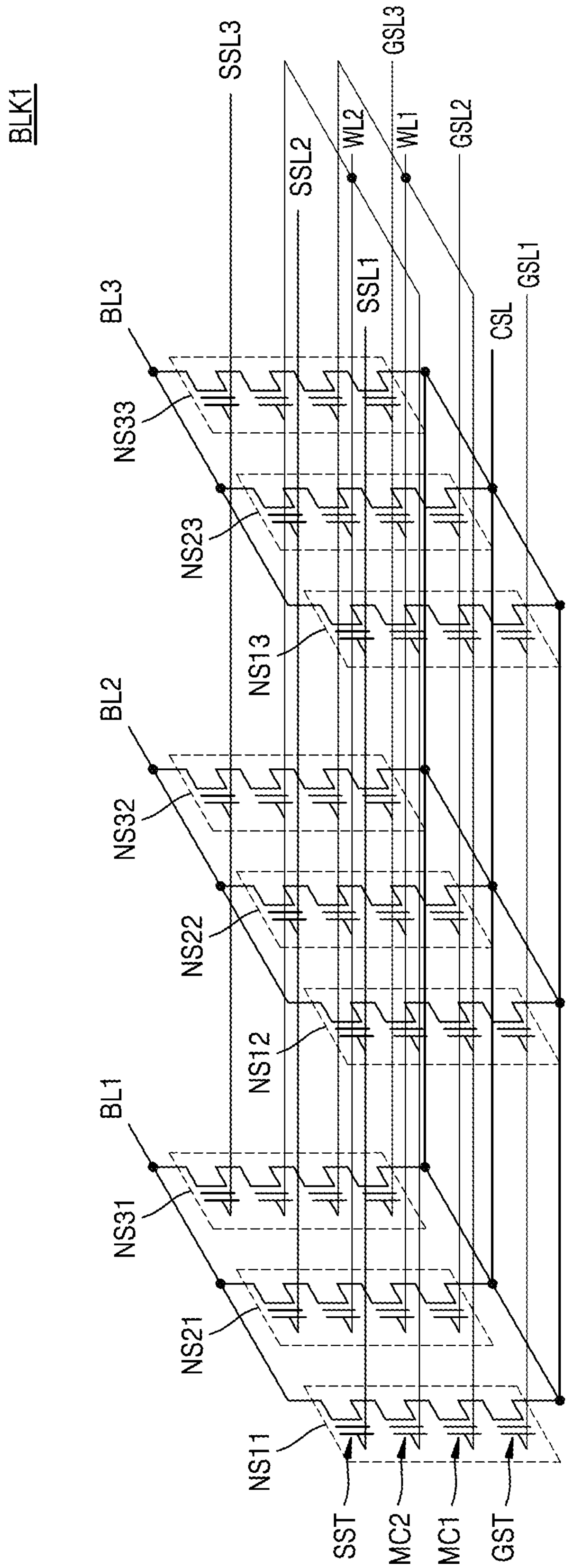
FIG. 3 is a circuit diagram of a first memory block included in the memory device of FIG. 2, according to some embodiments of the inventive concept.

FIG. 3 is a circuit diagram of a first memory block BLK1 included in the memory device 100 of FIG. 2, according to some embodiments of the inventive concept. Each of the remaining memory blocks BLK2 through BLKn may have the same configuration as the first memory block BLK1.

Referring to FIG. 3, the first memory block BLK1 may include a plurality of NAND cell strings, i.e., first through ninth NAND cell strings NS11, NS21, NS31, NS12, NS22, NS32, NS13, NS23, and NS33, a plurality of ground select lines GSL1 through GSL3, and a plurality of word lines, i.e., first and second word lines WL1 and WL2, a plurality of string select lines, i.e., first through third string select lines SSL1 through SSL3, a plurality of bit lines, i.e., first through third bit lines BL1 through BL3, and a common source line CSL. Although FIG. 3 shows nine NAND cell strings, three ground select lines, two word lines, three string select lines, and three bit lines, the number of ground select lines, the number of word lines, the number of string select lines, and the number of bit lines are not limited thereto, and may be variously changed.

Each of the first through ninth NAND cell strings NS11, NS21, NS31, NS12, NS22, NS32, NS13, NS23, and NS33 may each include a ground select transistor GST, a plurality of memory cells, i.e., first and second memory cells MC1 and MC2, and a string select transistor SST connected in series. Although FIG. 3 shows that each of the first through ninth NAND cell strings NS11, NS21, NS31, NS12, NS22, NS32, NS13, NS23, and NS33 includes one ground select transistor, two memory cells, and one string select transistor, the number of ground select transistors, the number of memory cells, and the number of string select transistors included therein are not limited thereto and may be variously changed.

Each ground select transistor GST may have a gate connected to one of the ground select lines GSL1 through GSL3. Each first memory cell MC1 may have a gate connected to the first word line WL1. Each second memory cell MC2 may have a gate connected to the second word line WL2. Each string select transistor SST may have a gate connected to one of the first through third string select lines SSL1 through SSL3.

The first through third NAND cell strings NS11, NS21, and NS31 may be connected between the first bit line BL1 and the common source line CSL. The fourth through sixth NAND cell strings NS12, SN22, and NS32 may be connected between the second bit line BL2 and the common source line CSL. The seventh through ninth NAND cell strings NS13, NS23, and NS33 may be connected between the third bit line BL3 and the common source line CSL.

NAND cell strings commonly connected to a bit line may be a column. For example, the first through third NAND cell strings NS11, NS21, and NS31 connected to the first bit line BL1 may be a first column. The fourth through sixth NAND cell strings NS12, NS22, and NS32 connected to the second bit line BL2 may be a second column. The seventh through ninth NAND cell strings NS13, NS23, and NS33 connected to the third bit line BL3 may be a third column.

NAND cell strings connected to a string select line may be a row. For example, the first, fourth, and seventh NAND cell strings NS11, NS12, and NS13 connected to the first string select line SSL1 may be a first row. The second, fifth, and eighth NAND cell strings NS21, NS22, and NS23 connected to the second string select line SSL2 may be a second row. The third, sixth, and ninth NAND cell strings NS31, NS32, and NS33 connected to the third string select line SSL3 may be a third row.

Figure 4:
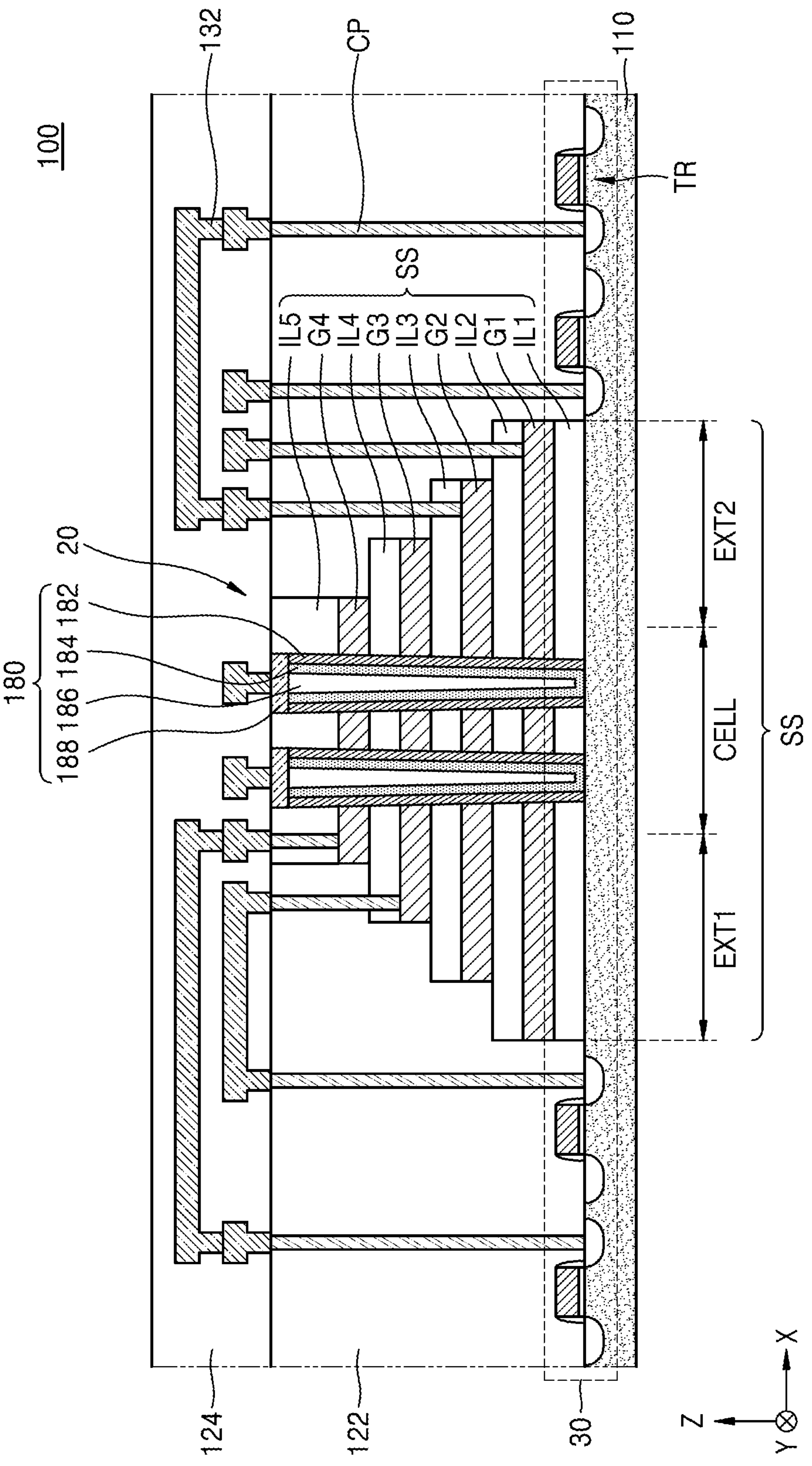
FIG. 4 is a cross-sectional view of a memory device according to some embodiments of the inventive concept.
Figure 5:
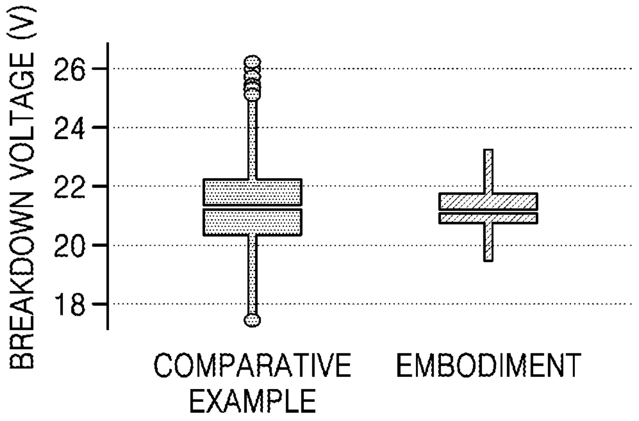
FIG. 5 is a graph illustrating variations of breakdown voltages of memory devices according to some embodiments of the inventive concept and a comparative example.
Figure 6:
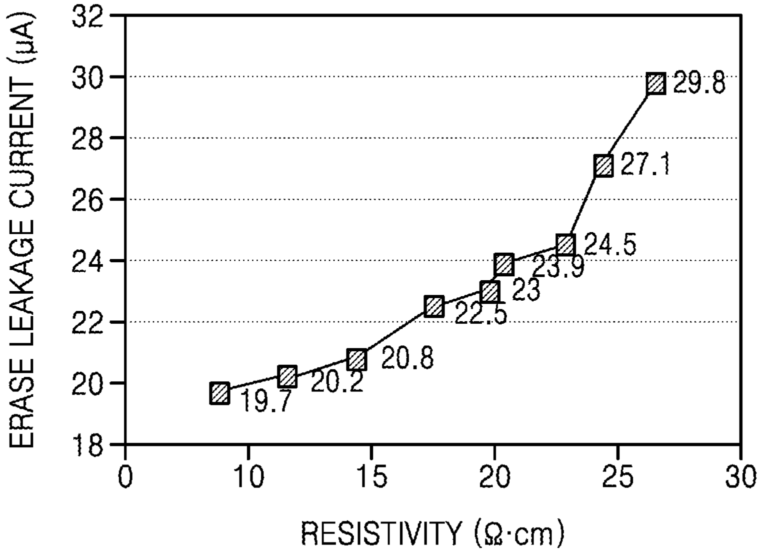
FIG. 6 is a graph illustrating erase leakage currents with respect to resistivities of memory devices according to some embodiments of the inventive concept.

FIG. 4 is a cross-sectional view of the memory device 100 according to some embodiments of the inventive concept. FIG. 5 is a graph illustrating variations of breakdown voltages of memory devices according to some embodiments of the inventive concept and a comparative example. FIG. 6 is a graph illustrating erase leakage currents with respect to resistivity of memory devices according to some embodiments of the inventive concept.

Referring to FIGS. 4 through 6, the memory device 100 may include a substrate 110. The substrate 110 may include silicon (Si), germanium (Ge), or a combination thereof. The substrate 110 may include p-type impurities and n-type impurities. The p-type impurities may include, for example, group 13 elements such as B, Al, Ga, In, etc. The n-type impurities may include, for example, group 15 elements such as P, As, etc. The n-type impurities in the substrate 110 may have a lower concentration than the p-type impurities therein. In other words, the substrate 110 may be a p-type substrate. A concentration of the n-type impurities in the substrate 110 may be in a range of about $2\times10^{14}$ atoms/cm$^3$ to about $1.5\times10^{15}$ atoms/cm$^3$. A concentration of the p-type impurities in the substrate 110 may be in a range of about $9\times10^{14}$ atoms/cm$^3$ to about $2\times10^{15}$ atoms/cm$^3$. The substrate 110 may be at least a portion of a wafer manufactured according to the wafer manufacturing method described with reference to FIGS. 1A through 1F. As described with reference to FIG. 1E, the substrate 110 may have a resistivity of about 14 Ω·cm to about 17 Ω·cm.

The memory device 100 may further include a peripheral circuit 30 on the substrate 110. For example, the row decoder 32, the page buffer 34, the data I/O circuit 36, and the control logic 38 shown in FIG. 2 may be arranged on the substrate 110. The peripheral circuit 30 may include a plurality of transistors TR. Although FIG. 4 shows four transistors TR, the number of transistors TR included in the peripheral circuit 30 is not limited thereto.

The memory device 100 may further include a 3D NAND memory cell array 20 on the substrate 110. The 3D NAND memory cell array 20 may include a stack structure SS and a plurality of channel structures 180. The stack structure SS may include first through fourth gate layers G1 through G4 that are alternately stacked with first through fifth interlayer insulating layers IL1 through IL5 on the substrate 110 one-by-one. In other words, the first through fourth gate layers G1 through G4 may be apart from one another by the first through fifth interlayer insulating layers IL1 through IL5. For example, the first interlayer insulating layer IL1, the first gate layer G1, the second interlayer insulating layer IL2, the second gate layer G2, the third interlayer insulating layer IL3, the third gate layer G3, the fourth interlayer insulating layer IL4, the fourth gate layer G4, and the fifth interlayer insulating layer IL5 may be sequentially stacked on the substrate 110. Although FIG. 4 illustrates an example in which the stack structure SS includes four gate layers and five interlayer insulation layers, the number of gate layers and the number of interlayer insulation layers included in the stack structure SS are not limited thereto.

The first through fifth interlayer insulating layers IL1 through IL5 and the first through fourth gate layers G1 through G4 may each extend in a first horizontal direction (an X direction). Each of the first through fifth interlayer insulating layers IL1 through IL5 may include silicon oxide ($SiO_2$), silicon nitride (SiN), or a combination thereof. Each of the first through fourth gate layers G1 through G4 may include tungsten (W), nickel (Ni), cobalt (Co), tantalum (Ta), tungsten nitride (WN), titanium nitride (TiN), and tantalum nitride (TaN), or a combination thereof.

The stack structure SS may include a cell region CELL, a first step region EXT1, and a second step region EXT2. The first step region EXT1 may include ends of the first through fourth gate layers G1 through G4 and the first through fifth interlayer insulating layers IL through IL5, and the ends of the first through fourth gate layers G1 through G4 and the first through fifth interlayer insulating layers IL through IL5 may have a stepped shape. The second step region EXT2 may include opposite ends of the first through fourth gate layers G1 through G4 and the first through fifth interlayer insulating layers IL through IL5, and the opposite ends of the first through fourth gate layers G1 through G4 and the first through fifth interlayer insulating layers IL through IL5 may have a stepped shape. The cell region CELL may extend in the first horizontal direction (the X direction) between the first and second step regions EXT1 and EXT2.

Each of the channel structures 180 may penetrate the cell region CELL of the stack structure SS in a vertical direction (a Z direction). Although FIG. 4 shows an example in which the number of channel structures 180 is 2, the number of channel structures 180 in the 3D NAND memory cell array 20 is not limited thereto. Each of the channel structures 180 may include a gate dielectric layer 182, a channel layer 184, a buried insulating layer 186, and a pad 188.

The channel layer 184 may penetrate the stack structure SS in a vertical direction (a Z direction) and contact the substrate 110. The channel layer 184 may have a hollow cylindrical shape. The channel layer 184 may include polysilicon and/or polygermanium. A space surrounded by the channel layer 184 may include the buried insulating layer 186. The buried insulating layer 186 may include, for example, an insulating material such as $SiO_2$, SiN, or a combination thereof. In some embodiments, the buried insulating layer 186 may be omitted. In this case, the channel layer 184 may have a pillar shape. The pad 188 may be located on the buried insulating layer 186 and be in contact with the channel layer 184. The pad 188 may include polysilicon, metal, metal nitride, or a combination thereof. The metal may include, for example, W, Ni, Co, Ta, etc.

The gate dielectric layer 182 may extend between the channel layer 184 and the stack structure SS. The gate dielectric layer 182 may include a tunneling dielectric layer, a charge storage layer, and a blocking dielectric layer sequentially stacked over the channel layer 184. The tunneling dielectric layer may include $SiO_2$, hafnium oxide ($HfO_2$), aluminum oxide ($Al_2O_3$), zirconium oxide ($ZrO_2$), tantalum oxide ($Ta_2O_5$), or a combination thereof. The charge storage layer may include SiN, boron nitride (BN), or polysilicon. The blocking dielectric layer may include $SiO_2$, SiN, $HfO_2$, $Al_2O_3$, $ZrO_2$, $Ta_2O_5$, or a combination thereof.

Each of the channel structures 180 and the first through fourth gate layers G1 through G4 may be one of the first through ninth NAND cell strings NS11, NS21, NS31, NS12, NS22, NS32, NS13, NS23, and NS33 shown in FIG. 3. Each of the channel structures 180 and the first gate layer G1 may be a ground select transistor GST of FIG. 3. Each channel structure 180 and the second gate layer G2 may be a first memory cell MC1 of FIG. 3. Each channel structure 180 and the third gate layer G3 may be a second memory cell MC2 of FIG. 3. Each channel structure 180 and the fourth gate layer G4 may be a string select transistor SST of FIG. 3.

In addition, the first gate layer G1 may include a plurality of portions spaced apart from each other in a second horizontal direction (a Y direction), and the portions of the first gate layer G1 may respectively correspond to the ground selection lines GSL1 through GSL3 of FIG. 3. The second gate layer G1 may correspond to the first word line WL1 of FIG. 3. The third gate layer G2 may correspond to the second word line WL2 of FIG. 3. The fourth gate layer G4 may include a plurality of portions spaced apart from each other in the second horizontal direction (the Y direction), and the portions of the fourth gate layer G4 may respectively correspond to the first through third string select lines SSL1 through SSL3 of FIG. 3. In some embodiments, the memory device 100 may further include a common source line layer in or on the substrate 110. The common source line layer may correspond to the common source line CSL of FIG. 3.

The memory device 100 may further include a plurality of contact plugs CP. The contact plugs CP may connect an interconnect structure 132 to the peripheral circuit 30 and the 3D NAND memory cell array 20. For example, the contact plugs CP may be in direct contact with the transistors TR and the first through fourth gate layers G1 through G4 and extend in the vertical direction (the Z direction). Each of the contact plugs CP may include, for example, copper (Cu), W, Al, gold (Au), silver (Ag), Ni, Ta, Ti, TaN, TiN, or a combination thereof.

The memory device 100 may further include a first insulating layer 122 covering or on the substrate 110, the peripheral circuit 30, and the 3D NAND memory cell array 20 and surrounding the contact plugs CP in plan view. The first insulating layer 122 may include $SiO_2$, SiN, a low dielectric constant (low-k) material, or a combination thereof.

The low-k material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxilane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), tonen silazen (TOSZ), fluorine silicate glass (FSG), polypropylene oxide (PPO), carbon doped silicon oxide (CDO), organosilicate glass (OSG), SiLK, fluorinated amorphous carbon (FAC), silica aerogel, silica xerogel, mesoporous silica, or a combination thereof.

The memory device 100 may further include the interconnect structure 132 for connecting the 3D NAND memory cell array 20 to the peripheral circuit 30. The interconnect structure 132 may include a plurality of conductive lines and a plurality of conductive vias. The conductive lines and the conductive vias may each include, for example, Cu, W, Al, Au, Ag, Ni, Ta, Ti, TaN, TiN, or a combination thereof.

The memory device 100 may further include a second insulating layer 124 on the first insulating layer 122. The second insulating layer 124 may surround the interconnect structure 132 in a plan view. The second insulating layer 124 may include $SiO_2$, SiN, a low-k material, or a combination thereof.

According to some embodiments of the inventive concept, the substrate 110 doped with the n- and p-type impurities may have a small resistivity variation. For example, the substrate 110 may have a resistivity of about 14 Ω·cm to about 17 Ω·cm, and a variation of the resistivity of the substrate 110 may be about 3 Ω·cm. According to a comparative example, a substrate may be doped with only p-type impurities and have a relatively larger resistivity variation. For example, the substrate may have a resistivity of about 14 Ω·cm to about 19 Ω·cm, and a variation of the resistivity of the substrate may be about 5 Ω·cm. According to some embodiments of the inventive concept, because the substrate 110 has a relatively small resistivity variation, a variation in device characteristics affected by the resistivity of the substrate 110 may be reduced.

For example, as seen on FIG. 5, a breakdown voltage of a transistor of a memory device according to a comparative example is in a range of about 17 V and about 26 V, and a variation of the breakdown voltage is about 9 V. On the other hand, a breakdown voltage of a transistor TR of the memory device 100 according to some embodiments of the inventive concept is in a range of about 19 V and about 24 V, and a variation of the breakdown voltage is about 5 V. In other words, by reducing the variation in the resistivity of the substrate 110, the variation in the breakdown voltage of the transistor TR may be reduced.

Similarly, as seen on FIG. 6, a leakage current of a transistor TR during an erase operation may change according to a resistivity of the substrate 110. Thus, in some embodiments of the inventive concept in which a variation in the resistivity of the substrate 110 is relatively small, a variation in the leakage current of the transistor TR during the erase operation may be reduced. For example, according to some embodiments of the inventive concept in which the resistivity of the substrate 110 is about 14 Ω·cm to about 17 Ω·cm, the leakage current of the transistor TR during the erase operation may be in a range of about 20.8 microamperes (μA) to about 22.5 μA.

Similarly, a standby current of the memory device 100 may vary according to the resistivity of the substrate 110. Thus, in some embodiments of the inventive concept in which a variation in the resistivity of the substrate 110 is relatively small, a variation in the standby current may be reduced. For example, according to some embodiments of the inventive concept in which the resistivity of the substrate 110 is about 14 Ω·cm to about 17 Ω·cm, the standby current of the memory device 100 may be 40 μA or less.

Figure 7:
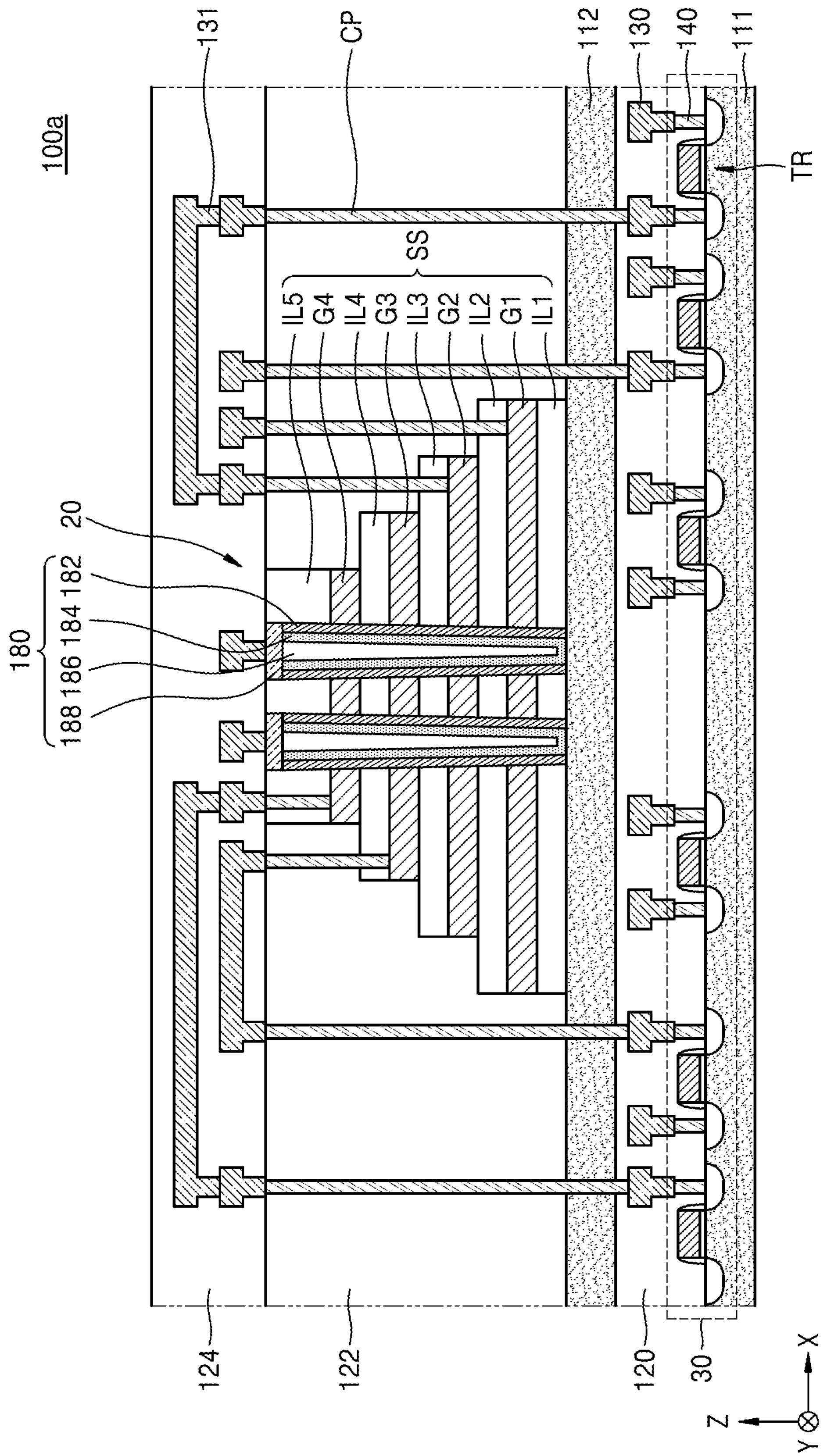
FIG. 7 is a cross-sectional view of a memory device according to some embodiments of the inventive concept.

FIG. 7 is a cross-sectional view of a memory device **100*a* according to some embodiments of the inventive concept. A difference between the memory device 100 of FIG. 4 and the memory device 100*a* of FIG. 7** is described.

Referring to FIG. 7, the memory device **100*a* may include a first substrate 111, a peripheral circuit 30 including a plurality of transistors TR on the first substrate 111, a third insulating layer 120 covering or on the first substrate 111 and the peripheral circuit 30, a second substrate 112 on the third insulating layer 120, and a 3D NAND memory cell array 20 on the second substrate 112. The memory device 100*a* may further include a first interconnect structure 130 and a plurality of contacts 140 that are connected to the peripheral circuit 30 and surrounded by the third insulating layer 120. The memory device 100*a* may further include a first insulating layer 122 covering or on the second substrate 112 and the 3D NAND memory cell array 20, a second insulating layer 124 on the first insulating layer 122, a second interconnect structure 131 within the second insulating layer 124, and a plurality of contact plugs CP connecting the second interconnect structure 131 to the 3D NAND memory cell array 20 and the peripheral circuit 30**.

The first substrate 111 may include Si, Ge, or a combination thereof. The first substrate 111 may include p-type impurities and n-type impurities. The p-type impurities may include, for example, group 13 elements such as B, Al, Ga, In, etc. The n-type impurities may include, for example, group 15 elements such as P, As, etc. The n-type impurities in the first substrate 111 may have a lower concentration than the p-type impurities therein. In other words, the first substrate 111 may be a p-type substrate. A concentration of the n-type impurities in the first substrate 111 may be in a range of about $2\times10^{14}$ atoms/cm$^3$ to about $1.5\times10^{15}$ atoms/cm$^3$. A concentration of the p-type impurities in the first substrate 111 may be in a range of about $9\times10^{14}$ atoms/cm$^3$ to about $2\times10^{15}$ atoms/cm$^3$. The first substrate 111 may be at least a portion of a wafer manufactured according to the wafer manufacturing method described with reference to FIGS. 1A through 1F. As described with reference to FIG. 1E, the first substrate 111 may have a resistivity of about 14 Ω·cm to about 17 Ω·cm.

The first interconnect structure 130 may include a plurality of conductive lines and a plurality of conductive vias. The conductive lines and the conductive vias may each include, for example, Cu, W, Al, Au, Ag, Ni, Ta, Ti, TaN, TiN, or a combination thereof.

The contacts 140 may connect the first interconnect structure 130 to the peripheral circuit 30. The contacts 140 may directly contact the peripheral circuit 30 and extend in the vertical direction (the Z direction). Each of the contacts 140 may include, for example, Cu, W, Al, Au, Ag, Ni, Ta, Ti, TaN, TiN, or a combination thereof.

The third insulating layer 120 may cover or overlap the first substrate 111 and the peripheral circuit 30 and surround the first interconnect structure 130. The third insulating layer 120 may include $SiO_2$, SiN, a low-k material, or a combination thereof.

The second substrate 112 may include Si, Ge, or a combination thereof. The second substrate 112 may further include p-type impurities. The p-type impurities may include, for example, group 13 elements such as B, Al, Ga, In, etc. The second substrate 112 may include little or no n-type impurities. The n-type impurities may include, for example, group 15 elements such as P, As, etc. In some embodiments, the n-type impurities in the second substrate 112 may have a lower concentration than the n-type impurities in the first substrate 111.

In some embodiments, the p- and n-type impurities in the second substrate 112 may respectively have the same or similar concentrations as those in the first substrate 111. In other words, the n-type impurities in the second substrate 112 may have a concentration of about $2\times10^{14}$ atoms/cm$^3$ to about $1.5\times10^{15}$ atoms/cm$^3$, and the p-type impurities therein may have a concentration of about $9\times10^{14}$ atoms/cm$^3$ to about $2\times10^{15}$ atoms/cm$^3$.

The second interconnect structure 131 may include a plurality of conductive lines and a plurality of conductive vias. The conductive lines and the conductive vias may each include, for example, Cu, W, Al, Au, Ag, Ni, Ta, Ti, TaN, TiN, or a combination thereof. The second interconnect structure 131 may be surrounded by the second insulating layer 124 in a plan view. The second interconnect structure 131 may be connected to the first interconnect structure 130 and the 3D NAND memory cell array 20 by the contact plugs CP.

Figure 8:
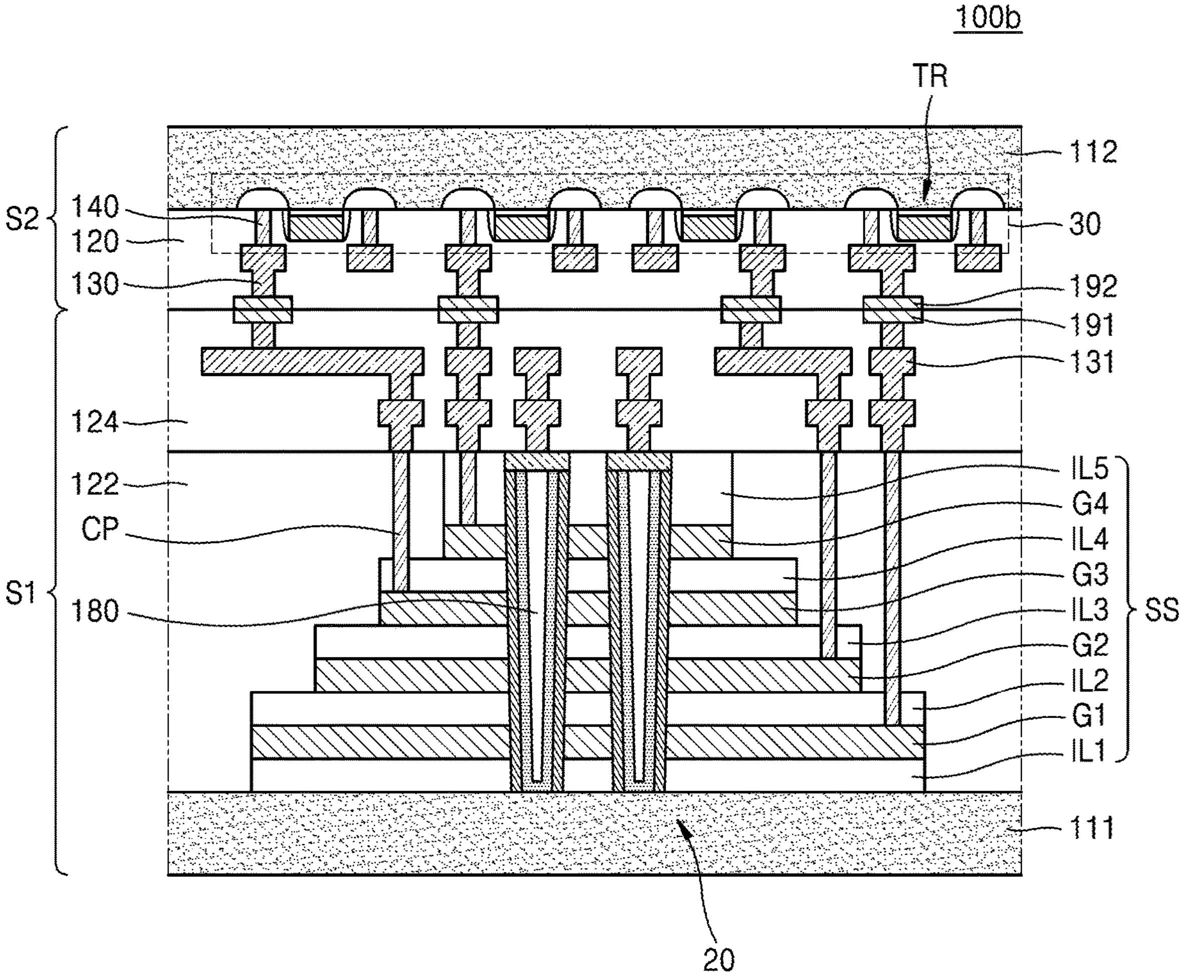
FIG. 8 is a cross-sectional view of a memory device according to some embodiments of the inventive concept.

FIG. 8 is a cross-sectional view of a memory device **100*b* according to some embodiments of the inventive concept. A difference between the memory device 100 of FIG. 4 and the memory device 100*b* of FIG. 8** is described.

Referring to FIG. 8, the memory device **100*b* may include a first structure S1 and a second structure S2 on the first structure S1**.

The first structure S1 may include a first substrate 111, a 3D NAND memory cell array 20 on the first substrate 111, a first insulating layer 122 covering or on the first substrate 111 and the 3D NAND memory cell array 20, a second insulating layer 124 on the first insulating layer 122, a second interconnect structure 131 within the second insulating layer 124, a plurality of contact plugs CP connecting the second interconnect structure 131 to the 3D NAND memory cell array 20, and a plurality of first bonding pads 191 on the second insulating layer 124.

The second structure S2 may include a second substrate 112, a peripheral circuit 30 on the second substrate 112, a third insulating layer 120 covering or on the second substrate 112 and the peripheral circuit 30, a first interconnect structure 130 in the third insulating layer 120, a plurality of contacts 140 connecting the first interconnect structure 130 to the peripheral circuit 30, and a plurality of second bonding pads 192 on the third insulating layer 120.

The second substrate 112 may include Si, Ge, or a combination thereof. The second substrate 112 may include p-type impurities and n-type impurities. The p-type impurities may include, for example, group 13 elements such as B, Al, Ga, In, etc. The n-type impurities may include, for example, group 15 elements such as P, As, etc. The n-type impurities in the second substrate 112 may have a lower concentration than the p-type impurities therein. In other words, the second substrate 112 may be a p-type substrate. A concentration of the n-type impurities in the second substrate 112 may be in a range of about $2\times10^{14}$ atoms/cm$^3$ to about $1.5\times10^{15}$ atoms/cm$^3$. A concentration of the p-type impurities in the second substrate 112 may be in a range of about $9\times10^{14}$ atoms/cm$^3$ to about $2\times10^{15}$ atoms/cm$^3$. The second substrate 112 may be at least a portion of a wafer manufactured according to the wafer manufacturing method described with reference to FIGS. 1A through 1F. As described with reference to FIG. 1E, the second substrate 112 may have a resistivity of about 14 Ω·cm to about 17 Ω·cm.

The first substrate 111 may include Si, Ge, or a combination thereof. The first substrate 111 may further include p-type impurities. The p-type impurities may include, for example, group 13 elements such as B, Al, Ga, In, etc. The first substrate 111 may include little or no n-type impurities. The n-type impurities may include, for example, group 15 elements such as P, As, etc. In some embodiments, the n-type impurities in the first substrate 111 may have a lower concentration than the n-type impurities in the second substrate 112.

In some embodiments, the p- and n-type impurities in the first substrate 111 may respectively have the same concentrations as those in the second substrate 112. In other words, the n-type impurities in the first substrate 111 may have a concentration of about $2\times10^{14}$ atoms/cm$^3$ to about $1.5\times10^{15}$ atoms/cm$^3$, and the p-type impurities therein may have a concentration of about $9\times10^{14}$ atoms/cm$^3$ to about $2\times10^{15}$ atoms/cm$^3$.

The second interconnect structure 131 may connect the first bonding pads 191 to the 3D NAND memory cell array 20. The first interconnect structure 130 may connect the second bonding pads 192 to the peripheral circuit 30.

The first bonding pads 191 may be respectively in contact with the second bonding pads 192. The first structure S1 may be physically and electrically connected to the second structure S2 by using Cu—Cu bonding between the first and second bonding pads 191 and 192. The first and second bonding pads 191 and 192 may each include, for example, Cu, Ni, W, Al, Au, Ag, Ti, TiN, or a combination thereof.

Figure 9:
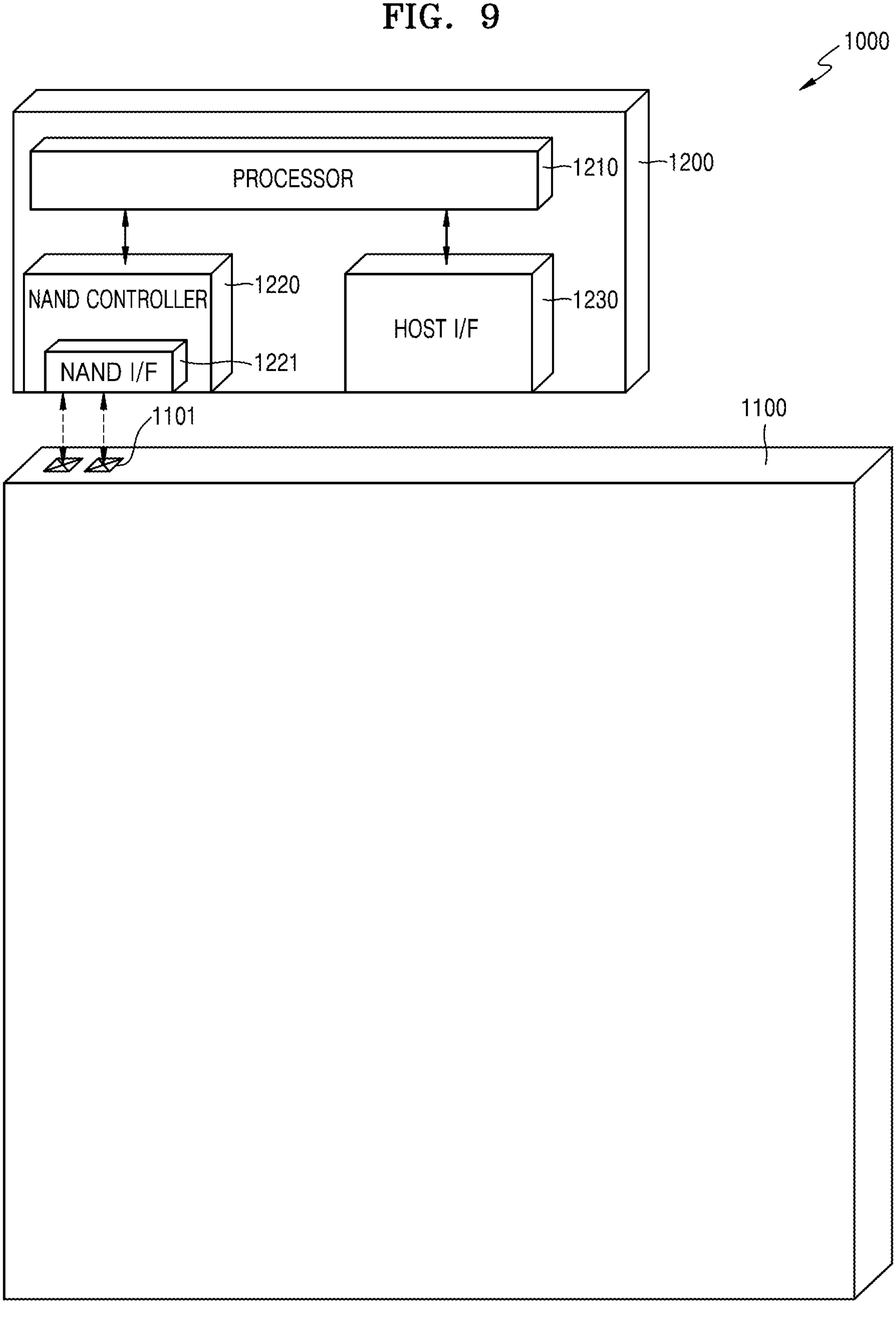
FIG. 9 is a schematic diagram of an electronic system including a memory device according to some embodiments of the inventive concept.

FIG. 9 is a schematic diagram of an electronic system 1000 including a memory device 1100 according to some embodiments of the inventive concept.

Referring to FIG. 9, the electronic system 1000 according to embodiments of the inventive concept may include the memory device 1100 and a controller 1200 connected to the memory device 1100. The electronic system 1000 may be a storage device including one or a plurality of memory devices 1100 or an electronic device including a storage device. For example, the electronic system 1000 may be a solid state drive (SSD) device, a universal serial bus (USB) device, a computing system, a medical device, or a communication device including at least one memory device 1100.

The memory device 1100 may be a 3D NAND flash memory device. For example, the memory device 1100 may include at least one of the memory device 100 of FIGS. 2 through 4, the memory device 100*a* of FIG. 7, and the memory device 100*b* of FIG. 8. The memory device 1100 may communicate with the controller 1200 via I/O pads 1101 electrically connected to the control logic (38 of FIG. 2).

The controller 1200 may include a processor 1210, a NAND controller 1220, and a host interface (I/F) 1230. According to some embodiments, the electronic system 1000 may include a plurality of memory devices 1100, and in this case, the controller 1200 may control the memory devices 1100.

The processor 1210 may control all operations of the electronic system 1000 including the controller 1200. The processor 1210 may operate by executing firmware, and control the NAND controller 1220 to access the memory device 1100. The NAND controller 1220 may include a NAND I/F 1221 for processing communication with the memory device 1100. Control commands for controlling the memory device 1100, data to be written to the memory device 1100, data to be read from the memory device 1100 may be transmitted to the memory device 1100 via the NAND I/F 1221. The host I/F 1230 may provide a function of communication interface between the electronic system 1000 and an external host. When a control command is received from the external host via the host I/F 1230, the processor 1210 may control the memory device 1100 in response to the control command.

Figure 10:
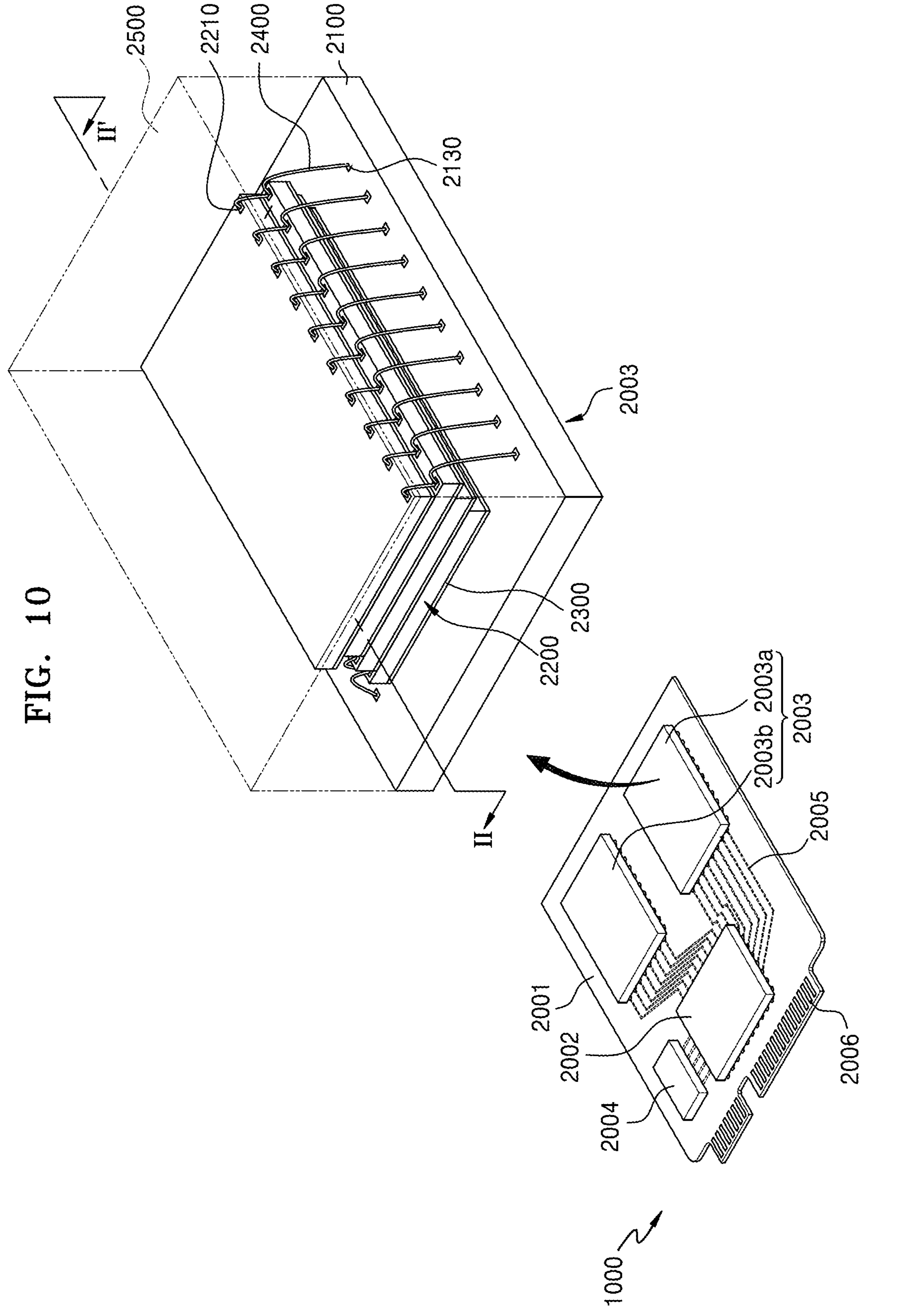
FIG. 10 is a schematic diagram of an electronic system including a memory device, according to some embodiments of the inventive concept.

FIG. 10 is a schematic diagram of the electronic system 1000 including a memory device, according to some embodiments of the inventive concept.

Referring to FIG. 10, the electronic system 1000 may include a main substrate 2001, a controller 2002 mounted on the main substrate 2001, one or more semiconductor packages 2003, and dynamic random access memory (DRAM) 2004. The semiconductor package 2003 and the DRAM 2004 may be interconnected to the controller 2002 by a plurality of interconnect patterns 2005 formed on the main substrate 2001.

The main substrate 2001 may include a connector 2006 including a plurality of pins coupled to an external host. The number and arrangement of pins in the connector 2006 may vary depending on a type of a communication I/F between the electronic system 1000 and the external host. In example embodiments, the electronic system 1000 may communicate with the external host using one of interfaces such as USB, Peripheral Component Interconnect Express (PCI-Express), Serial Advanced Technology Attachment (SATA), M-PHY for Universal Flash Storage (UFS), etc. In example embodiments, the electronic system 1000 may operate using power supplied from the external host via the connector 2006. The electronic system 1000 may further include a power management integrated circuit (PMIC) that distributes the power supplied from the external host to the controller 2002 and the semiconductor package 2003.

The controller 2002 may write or read data to or from the semiconductor package 2003, and improve an operating speed of the electronic system 1000.

The DRAM 2004 may be a buffer memory for reducing a speed difference between the external host and the semiconductor package 2003 that is a data storage space. The DRAM 2004 included in the electronic system 1000 may also operate as a type of a cache memory, and provide a space for temporarily storing data during a control operation on the semiconductor package 2003. When the DRAM 2004 is included in the electronic system 1000, the controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b* separated from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, the semiconductor chips 2200 on the package substrate 2100, adhesive layers 2300 respectively arranged on lower surfaces of the semiconductor chips 2200, connection structures 2400 for electrically connecting the semiconductor chips 2200 to the package substrate 2100, and a molding layer 2500 covering or on the semiconductor chips 2200 and the connection structures 2400 on the package substrate 2100.

The package substrate 2100 may be a printed circuit board (PCB) including a plurality of package upper pads 2130. Each of the semiconductor chips 2200 may include I/O pads 2210. The I/O pads 2210 may correspond to the I/O pads 1101 of FIG. 9. Each of the semiconductor chips 2200 may include at least one of the memory device 100 of FIGS. 2 through 4, the memory device 100*a* of FIG. 7, and the memory device 100*b* of FIG. 8.

In example embodiments, the connection structures 2400 may be bonding wires for electrically and respectively connecting the I/O pads 2210 to the package upper pads 2130. Thus, in each of the first and second semiconductor packages 2003*a* and 2003*b*, the semiconductor chips 2200 may be electrically connected to each other and to the package upper pads 2130 of the package substrate 2100 through bonding wires. According to embodiments, in each of the first and second semiconductor packages 2003*a* and 2003*b*, the semiconductor chips 2200 may be electrically connected to each other by a connection structure including a through-silicon via (TSV), instead of the connection structures 2400 using bonding wires.

In example embodiments, the controller 2002 and the semiconductor chips 2200 may be included in a single package. In an example embodiment, the controller 2002 and the semiconductor chips 2200 may be mounted on a separate interposer substrate that is different from the main substrate 2001, and may be connected to each other through wires formed on the interposer substrate.

Figure 11:
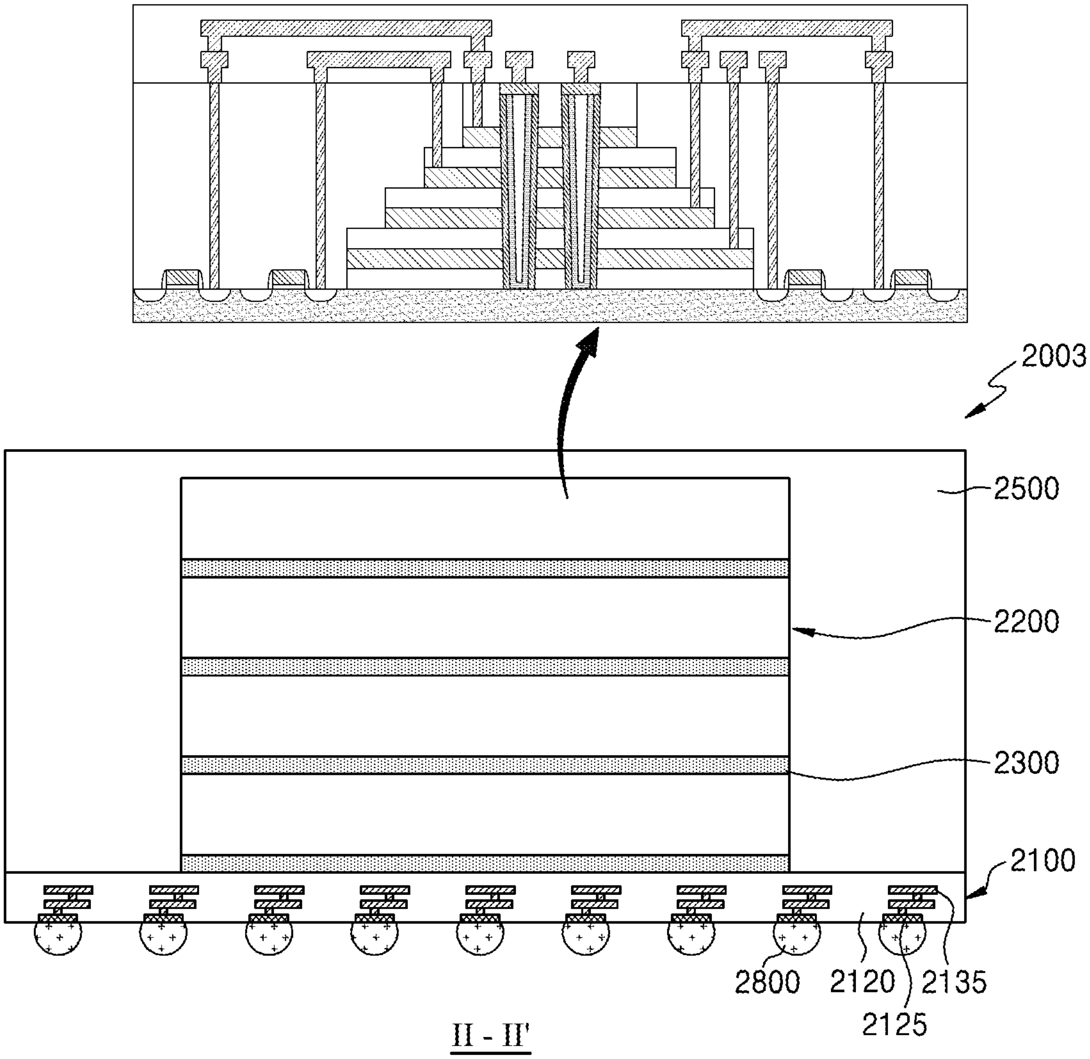
FIG. 11 is a cross-sectional view of a semiconductor package including a memory device according to some embodiments of the inventive concept, which is taken along line II-II' of FIG. 10.

FIG. 11 is a cross-sectional view of the semiconductor package 2003 including a memory device according to some embodiments of the inventive concept, which is taken along line II-II' of FIG. 10.

Referring to FIG. 11, in the semiconductor package 2003, the package substrate 2100 may be a PCB. The package substrate 2100 may include a package substrate body 2120, the package upper pads (2130 of FIG. 10) arranged on an upper surface of the package substrate body 2120, a plurality of lower pads 2125 arranged on a lower surface of the package substrate body 2120 or exposed through the lower surface thereof, and a plurality of internal interconnects 2135 for electrically connecting the package upper pads 2130 to the lower pads 2125 within the package substrate body 2120. The lower pads 2125 may be connected to the interconnect patterns 2005 on the main substrate 2001 of the electronic system 1000 of FIG. 10 through a plurality of conductive connections 2800. Each of the semiconductor chips 2200 may include at least one of the memory device 100 of FIGS. 2 through 4, the memory device 100*a* of FIG. 7, and the memory device 100*b* of FIG. 8.

While the inventive concept has been particularly shown and described with reference to embodiments thereof, it will be understood that various changes in form and details may be made therein without departing from the spirit and scope of the following claims.

What is claimed is:

1. A memory device comprising:
- a first substrate;
- a peripheral circuit comprising a transistor on the first substrate;
- an insulating layer on the first substrate and on the peripheral circuit;
- a second substrate on the insulating layer; and
- a three-dimensional (3D) NAND memory cell array on the second substrate,
- wherein the first substrate comprises p-type impurities and n-type impurities,
- wherein a concentration of the n-type impurities in the first substrate is lower than a concentration of the p-type impurities in the first substrate,
- wherein the concentration of the n-type impurities in the first substrate is $2\times10^{14}$ atoms/$cm^3$ to $1.5\times10^{15}$ atoms/$cm^3$, and the concentration of the p-type impurities in the first substrate is $9\times10^{14}$ atoms/$cm^3$ to $2\times10^{15}$ atoms/$cm^3$,
- wherein a resistivity of the first substrate is 14 ohms centimeter (Ω·cm) to 17 Ω·cm, and
- wherein a concentration of the n-type impurities in the second substrate is lower than the concentration of the n-type impurities in the first substrate.

2. The memory device of claim 1, wherein a breakdown voltage of the transistor is 19 volts (V) to 24 V.

3. The memory device of claim 1, wherein a standby current of the memory device is less than or equal to 40 microamperes (μA).

4. The memory device of claim 1, wherein a leakage current of the transistor during an erase operation of the memory device is 20.8 microamperes (μA) to 22.5 μA.

5. The memory device of claim 1, wherein the 3D NAND memory cell array comprises:
- a stack structure comprising a plurality of gate layers alternately stacked with a plurality of interlayer insulating layers on the second substrate; and
- a plurality of channel structures, wherein ones of the plurality of channel structures penetrate the stack structure in a vertical direction perpendicular to the second substrate.

6. The memory device of claim 1, wherein the second substrate comprises single crystal silicon.

7. A memory device comprising a first structure and a second structure on the first structure,
- wherein the first structure comprises:
- a first substrate;
- a three-dimensional (3D) NAND memory cell array on the first substrate;
- a first insulating layer on the first substrate and on the 3D NAND memory cell array; and
- a plurality of first bonding pads on the first insulating layer and electrically connected to the 3D NAND memory cell array, and
- wherein the second structure comprises:
- a second substrate;
- a peripheral circuit comprising a transistor on the second substrate;
- a second insulating layer on the second substrate and the peripheral circuit; and
- a plurality of second bonding pads on the second insulating layer and electrically connected to the peripheral circuit, wherein the plurality of first bonding pads are respectively in contact with the plurality of second bonding pads, wherein the second substrate comprises p-type impurities and n-type impurities, wherein a concentration of the n-type impurities in the second substrate is lower than a concentration of the p-type impurities in the second substrate, wherein the concentration of the n-type impurities in the second substrate is $2\times10^{14}$ atoms/$cm^3$ to $1.5\times10^{15}$ atoms/$cm^3$, and the concentration of the p-type impurities in the second substrate is $9\times10^{14}$ atoms/$cm^3$ to $2\times10^{15}$ atoms/$cm^3$, wherein a resistivity of the second substrate is 14 ohms centimeter (Ω·cm) to about 17 Ω·cm, and wherein a concentration of the n-type impurities in the first substrate is lower than the concentration of the n-type impurities in the second substrate.

8. The memory device of claim 7, wherein a breakdown voltage of the transistor is 19 volts (V) to 24 V.

9. The memory device of claim 7, wherein a standby current of the memory device is less than or equal to 40 microamperes (μA).

10. The memory device of claim 7, wherein a leakage current of the transistor during an erase operation of the memory device is 20.8 microamperes (μA) to 22.5 μA.

11. The memory device of claim 7, wherein the 3D NAND memory cell array comprises:

a stack structure comprising a plurality of gate layers alternately stacked with a plurality of interlayer insulating layers on the second substrate; and a plurality of channel structures, wherein ones of the plurality of channel structures penetrate the stack structure in a vertical direction that is perpendicular to the second substrate.

* * * * *